(12) United States Patent
Schmidt et al.

(10) Patent No.: US 9,234,448 B2
(45) Date of Patent: Jan. 12, 2016

(54) MUFFLER

(75) Inventors: Jürgen Schmidt, Mühlacker (DE); Michael Herbig, Uhlandstrasse (DE)

(73) Assignee: FRIEDRICH BOYSEN GMBH & CO. KG (DE)

( * ) Notice: Subject to any disclaimer, the term of this patent is extended or adjusted under 35 U.S.C. 154(b) by 201 days.

(21) Appl. No.: 13/814,321

(22) PCT Filed: Aug. 2, 2011

(86) PCT No.: PCT/EP2011/003874
§ 371 (c)(1),
(2), (4) Date: May 20, 2013

(87) PCT Pub. No.: WO2012/016684
PCT Pub. Date: Feb. 9, 2012

(65) Prior Publication Data
US 2013/0283764 A1    Oct. 31, 2013

(30) Foreign Application Priority Data

Aug. 6, 2010  (DE) .......................... 10 2010 033 607

(51) Int. Cl.
*F01N 3/02* (2006.01)
*F01N 5/02* (2006.01)
*F01N 13/08* (2010.01)
*F01N 1/00* (2006.01)
(Continued)

(52) U.S. Cl.
CPC .. *F01N 5/00* (2013.01); *F01N 1/00* (2013.01);
*F01N 5/02* (2013.01); *F01N 5/025* (2013.01);
*H01L 35/30* (2013.01); *F01N 2240/02* (2013.01); *F01N 2470/02* (2013.01); *Y02T 10/16* (2013.01)

(58) Field of Classification Search
CPC ............. F01N 5/00; F01N 5/02; F01N 5/025;
F01N 2240/02; F01N 2470/02; Y02T 10/16
USPC ..................... 60/320; 181/227, 228, 247, 248
See application file for complete search history.

(56) References Cited

U.S. PATENT DOCUMENTS

| 6,164,412 A * | 12/2000 | Allman .......................... 181/272 |
| 8,247,679 B2 | 8/2012 | Rostek et al. |
| 2003/0223919 A1* | 12/2003 | Kwak et al. .................. 422/174 |

(Continued)

FOREIGN PATENT DOCUMENTS

| DE | 102007063171 A1 | 6/2009 |
| DE | 102008022802 | 11/2009 |

(Continued)

OTHER PUBLICATIONS

EP Search Report relating to EP Patent Application No. 13153620.3 dated Mar. 4, 2013; 3 pgs.

(Continued)

*Primary Examiner* — Audrey K Bradley
(74) *Attorney, Agent, or Firm* — Cantor Colburn LLP

(57) ABSTRACT

A muffler for an exhaust gas system of an internal combustion engine, the muffler including a muffler housing, at least one exhaust gas inlet, at least one gas outlet and at least one muffling device arranged in the muffler housing. At least one cooling element arranged in the muffler housing is configured to extract heat energy from the exhaust gas and is arranged in the muffler housing.

22 Claims, 3 Drawing Sheets

(51) Int. Cl.
   *F01N 5/00* (2006.01)
   *H01L 35/30* (2006.01)

(56) References Cited

U.S. PATENT DOCUMENTS

| | | | |
|---|---|---|---|
| 2005/0284623 A1 | 12/2005 | Poole et al. | |
| 2007/0045044 A1 | 3/2007 | Sullivan | |
| 2007/0084496 A1* | 4/2007 | Edey | 136/201 |

FOREIGN PATENT DOCUMENTS

| | | |
|---|---|---|
| DE | 102008022934 | 12/2009 |
| DE | 202010003049 | 8/2010 |
| FR | 495265 A | 6/1919 |
| JP | 200018095 | 1/2000 |
| JP | 2007113559 | 5/2007 |
| JP | 2007270702 | 10/2007 |
| JP | 2007270702 A * | 10/2007 ............. F01N 5/02 |

OTHER PUBLICATIONS

English Translation of EP Search Report relating to EP Patent Application No. 13153620.3 dated Mar. 4, 2013; 5 pgs.
English Translation of the International Preliminary Report on Patentability, dated Feb. 28, 2013; 7 pgs.
Translation of German Search Report relating to German Patent Application No. 10 2010 033 607.6; dated Apr. 1, 2011; 5 pgs.
Search Report from corresponding German Patent Application No. 10 2010 033 607.6; dated Apr. 1, 2011; 4 pgs.

* cited by examiner

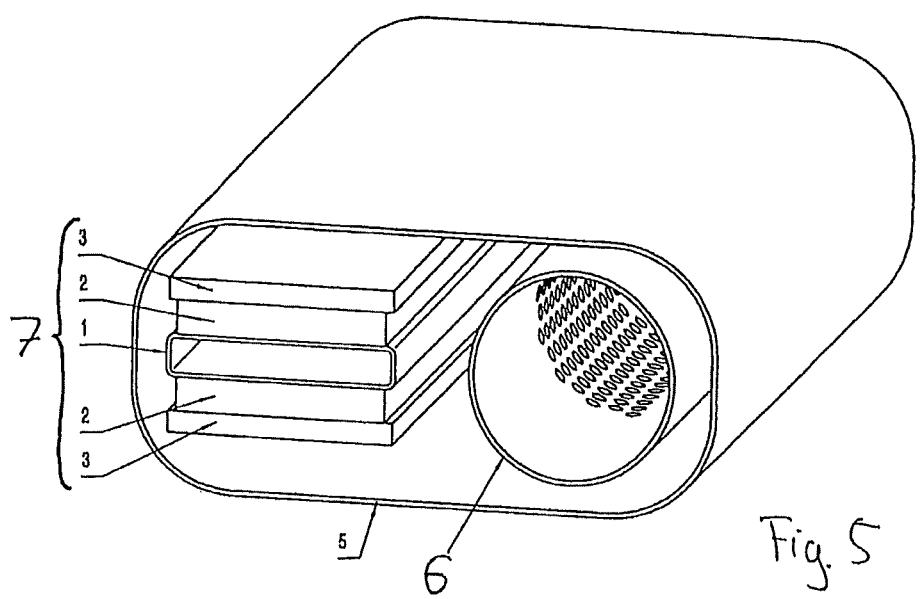

MUFFLER

CROSS REFERENCE TO RELATED APPLICATIONS

This patent application claims the benefit of priority to PCT Application No. PCT/EP2011/003874, filed Aug. 2, 2011, which claims the benefit of priority to German Patent Application No. 102010033607.6, filed Aug. 6, 2010, which are both incorporated herein by reference in their entirety.

FIELD OF THE INVENTION

The subject matter herein relates to a muffler for an exhaust gas system of an internal combustion engine.

BACKGROUND

Mufflers are provided in exhaust gas systems of internal combustion engines to damp pressure surges which arise upon the fast opening of the outlet valves and to reduce noise emission. Different kinds of muffling devices are arranged in the interior of a muffler housing for the purpose of muffling. Examples of such devices include perforated pipes, chambers, insulating material and/or pipes with varying cross-sections. Further muffling devices are present in arrangements which divide the exhaust gas flow into a plurality of part flows of different lengths, whereby sound waves partly cancel one another out by phase-shifted superimposition due to interference effects.

A substantial proportion of the energy supplied by the fuel is lost in the form of heat energy through the exhaust gas system in internal combustion engines. It is advantageous in this respect to utilize at least a portion of this waste heat present in the exhaust gas and convert it into useful energy. There is only a limited construction space available for the exhaust gas system, particularly with internal combustion engines installed in motor vehicles. It is therefore frequently difficult to integrate devices required to utilize the waste heat into the exhaust gas system.

SUMMARY

It is therefore a feature of the invention to provide a muffler which can convert the heat energy contained in the exhaust gas into useful energy and which only takes up a small construction space.

This is satisfied by a muffler for an exhaust gas system of an internal combustion engine. The muffler includes a muffler housing, at least one exhaust gas inlet, at least one exhaust gas outlet and at least one muffling device arranged in the muffler housing. Also included is at least one cooling element configured to extract heat energy from the exhaust gas and arranged in the muffler housing.

It is utilized in this respect that heat energy is extracted from the exhaust gas by the cooling element. The cooling thereby effects a reduction in the exhaust gas volume flow as well as in the pressure surges or sound waves led off through the exhaust gas system and thus effects a reduction in noise emission. The heat energy extracted from the exhaust gas can be otherwise utilized and thus contribute in an advantageous manner to an increase in efficiency of the internal combustion engine.

In accordance with one embodiment, a heat exchanger, such as a heat exchanger which can be flowed through by a cooling medium, in particular air, water or oil, can be provided as a cooling element. The cooling medium heated by the exhaust gas can be used for heating an occupant space or for the faster heating of the internal combustion engine. Water can, for example, be provided as a cooling medium which circulates in a separate cooling circuit, which is in particular provided with a further heat exchanger. However, the cooling water can also be used, which circulates in a cooling circuit present for the cooling of the internal combustion engine. Air, particularly environmental air or compressed air produced by a compressed air apparatus of a commercial vehicle, can be used as a further cooling medium. Furthermore, an evaporation cooler, a recuperator or a superheater can be provided as a heat exchanger. The environmental air can be sucked into the muffler via the pipe flow. A thermoelectric generator can furthermore also be provided as a cooling element, as will be explained in more detail in the following.

In accordance with another embodiment of the invention, the muffling device in the muffler housing is selected while taking account of the muffling power of the cooling element.

It is thereby possible to give smaller dimensions to conventional muffling devices of the initially named kind which should be additionally arranged in the muffler housing in addition to the cooling element and/or to reduce them in number or to dispense completely with additional muffling devices.

In accordance with a further embodiment, the cooling element is a thermoelectric generator whose high-temperature side is in heat exchanging communication with the exhaust gas and whose low temperature side is shielded from the exhaust gas.

With thermoelectric generators, an electric voltage is generated on a temperature difference due to the Seebeck effect between two conductors which comprise different materials and which are connected to one another at one end. The connection point and the free ends have different temperatures. The two conductors comprise different metals or two differently doped semiconductor materials and form a so-called thermal element. In a thermoelectric generator, a plurality of thermal elements are connected to one another as a rule to reach the desired voltages or currents.

Since the high temperature side of the thermoelectric generator is thermally coupled to the exhaust gas and the low temperature side is shielded from the exhaust gas in a muffler housing, the temperature difference is reached, which is required for generating useful energy in the form of electrical energy. Heat energy is extracted from the exhaust gas by the generation of electrical energy by the thermoelectric generator. The cooling thereby caused simultaneously effects the desired reduction in the exhaust gas volume. The electrical energy can, for example, be fed into the onboard power supply of a motor vehicle so that the usually present generator driven by the internal combustion engine is relieved or even becomes completely superfluous.

The additional space requirement is small due to the integration of the thermoelectric generator into the muffler since a sufficient construction space for the installation of thermoelectric generators is available in the mufflers as a rule.

The installation space required for the integration of the thermoelectric generator into the muffler housing can be compensated by the utilization of the muffling effect of the thermoelectric generator so that ultimately a muffler provided with a thermoelectric generator is smaller or at least not larger than a conventional muffler without a thermoelectric generator with the same muffling power.

At least one tube passage, in particular a flat passage, which can be flowed through by exhaust gas, arranged in the muffler housing and is thermally coupled to the cooling element, in particular to the high temperature side of the thermoelectric generator. The desired shielding of the low temperature side is thereby reached by the exhaust gas and simultaneously a direct contact of the exhaust gas with the thermoelectric generator, which reduces the service life, is avoided.

The muffling device advantageously includes the duct. In this respect, the muffling takes place directly by the cooling of the exhaust gas flowing through the duct by extraction of the heat energy.

In accordance with a further embodiment, no further muffling device is arranged in the muffler housing except for the duct. A larger portion of the construction space available in the muffler housing can hereby be utilized for the arrangement of one or more cooling elements, in particular thermoelectric generators. The design is simplified by the dispensing with of muffling devices not coupled to the cooling elements, in particular the thermoelectric generators.

At least one further damping device, which is not thermally coupled to a cooling element, in particular a pipe which can be flowed through by exhaust gas, is preferably arranged in the muffler housing beside the cooling element, in particular a duct. A high muffling power is hereby achieved.

In one embodiment, the duct and/or the pipe has/have perforations which are provided at wall sections not coupled to a cooling element. The muffling is hereby further increased.

In accordance with a further embodiment, the duct and the pipe are connected to one another at the exhaust gas inlet side and at the exhaust gas outlet side. The exhaust gas flow is therefore divided into two or more part flows, with the part flow flowing through the duct being cooled, while the part flow flowing through the pipe substantially maintains its temperature. Ultimately, pressure differences and/or running time differences thereby arise in both part flows which as a result produce a damping of the pressure surges in the exhaust gas flow.

The duct is formed as a flat passage, with at least one of the two mutually oppositely disposed side surfaces, which have the larger length in cross-section, being thermally coupled to the cooling element, in particular to the high temperature side of the thermoelectric generator. The use of commercial cooling elements, in particular thermoelectric generators, is facilitated by the configuration of the duct with planar side surfaces. This embodiment furthermore allows the particularly efficient utilization of the duct surface as well as a high packing density in the muffler housing.

In one embodiment, at least one cooling device is arranged in the muffler housing and is coupled to the cooling element, in particular to the low temperature side of the thermoelectric generator. A particularly efficient shielding of the low temperature side from the exhaust gas is hereby ensured. The temperature difference between the high temperature side and the low temperature side can be further increased by the cooling device, which increases the efficiency of the thermoelectric generator.

In accordance with a further embodiment of the invention, the cooling device has at least one coolant passage which can be flowed through by coolant and which is in particular configured as a flat passage. The efficiency of the cooling and thus the temperature difference effective at the thermoelectric generator can hereby be further increased.

In one embodiment, the duct is formed as a flat passage, with at least one of the two mutually oppositely disposed side surfaces, which have the larger length in cross-section, being coupled to the cooling element, in particular to the low temperature side of at least one thermoelectric generator. The construction space required in the muffler housing is hereby further reduced. A stack arrangement can in particular thereby be realized in which one or more thermoelectric generators are arranged between a cooling passage configured as a flat passage and a duct configured as a flat passage.

In accordance with another embodiment of the invention, the cooling device and the duct are thermally coupled via the cooling element, in particular via the thermoelectric generator, and additionally mechanically via thermally insulating insulation elements, with forces active between the cooling device and the duct substantially only being transmitted via the insulation elements. A particularly efficient separation of the high temperature side and the low temperature side of the thermoelectric generator and simultaneously a tension-free support of the thermoelectric generators are hereby achieved.

Further embodiments of the invention result from the dependent claims, from the description and from the drawings.

BRIEF DESCRIPTION OF THE DRAWINGS

The invention will be described in the following with reference to an embodiment and to the drawings. There are shown:

FIG. 5 is a perspective sectional view of another embodiment of the muffler.

DETAILED DESCRIPTION

Figure 1:
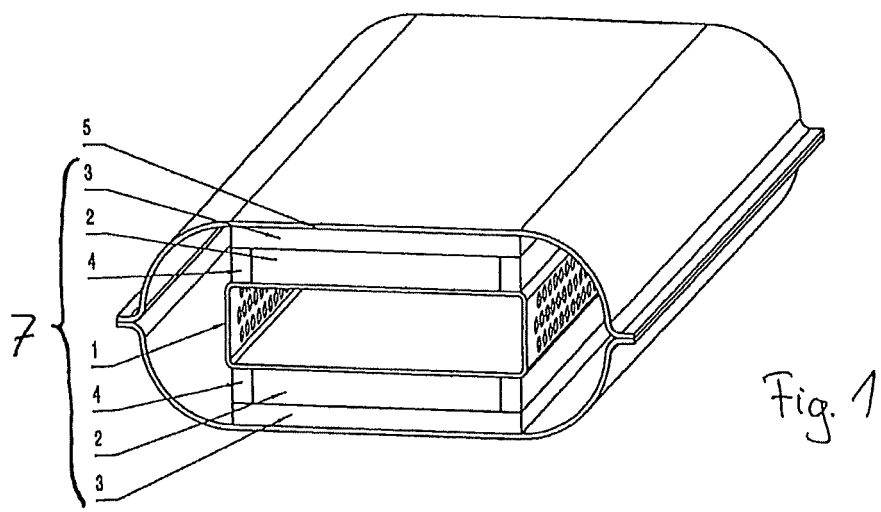
FIG. 1 is a perspective sectional view of an embodiment of a muffler in accordance with the invention.

In accordance with FIGS. 1 to 5, a muffler in accordance with the invention includes in all embodiments a muffler housing 5 which has an oval cross-section and is composed of an upper shell and a lower shell (FIGS. 1 to 4) or is configured in one piece (FIG. 5). Other cross-sections and/or construction shapes are possible. One or more ducts 1 which can be flowed through by exhaust gas are arranged in the interior of the muffler housing 5 and are connected to an exhaust gas inlet and to an exhaust gas outlet (not shown) of the muffler in a known manner, for example fixedly or by means of a sliding seat.

The ducts 1 are each configured as flat passages with rectangular cross-sections, with the side surfaces which have substantially the larger length in cross-section extending in a horizontal plane in the representation chosen here. Thermoelectric generators 2 are arranged both on the upper side and on the lower side of the ducts 1. Such thermoelectric generators 2 are in particular commercially available in the form of modules of different sizes. Where a thermoelectric generator 2 is spoken of generally here, this does not preclude that it can be a question of a plurality of thermoelectric generator modules arranged next to one another and/or behind one another.

While the higher temperature sides of the thermoelectric generators 2 are in thermally conductive communication with the associated outer side of the duct 1, the low temperature sides of the thermoelectric generators 2 disposed opposite the high temperature sides are each in thermally conductive communication with a cooling device 3. The at least one duct 1, the thermoelectric generators 2 and the cooling device 3 are components of a generator arrangement 7.

The cooling device 3 only shown schematically here can, for example, be flat passages which are flowed through by coolant or also thermally conductive elements which connect the low temperature sides of the thermoelectric generators 2 to temperature sinks.

Figure 2:
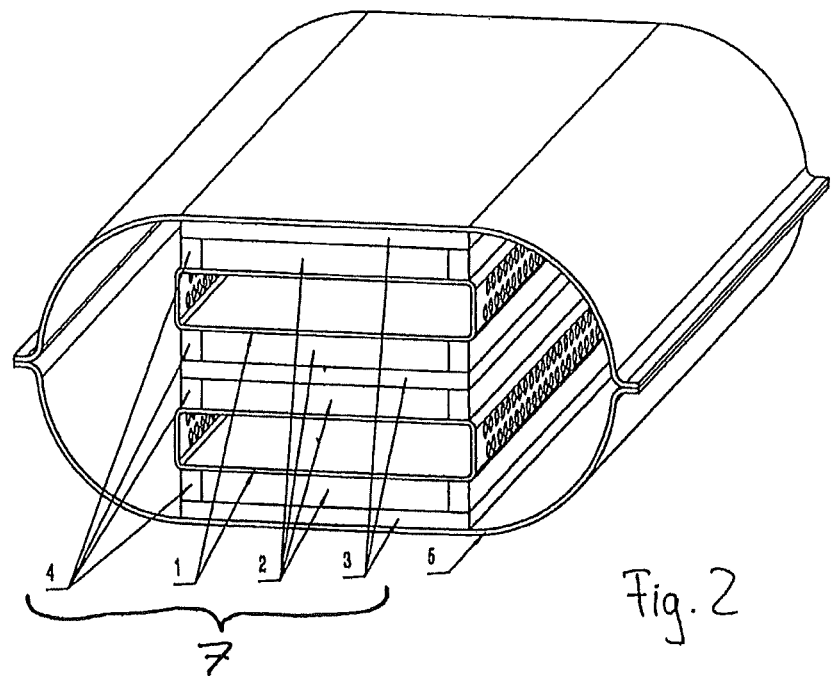
FIG. 2 is a perspective sectional view of another embodiment of the muffler.

In the embodiments in accordance with FIGS. 1 and 2, those side surfaces of the duct or passages 1 extending in the vertical direction and not coupled to a thermoelectric generator have a perforation. The ducts 1 here form the only damping device, with it therewith not being precluded that damping material can also additionally be provided between the ducts 1 and the damper housing 5.

Figure 3:
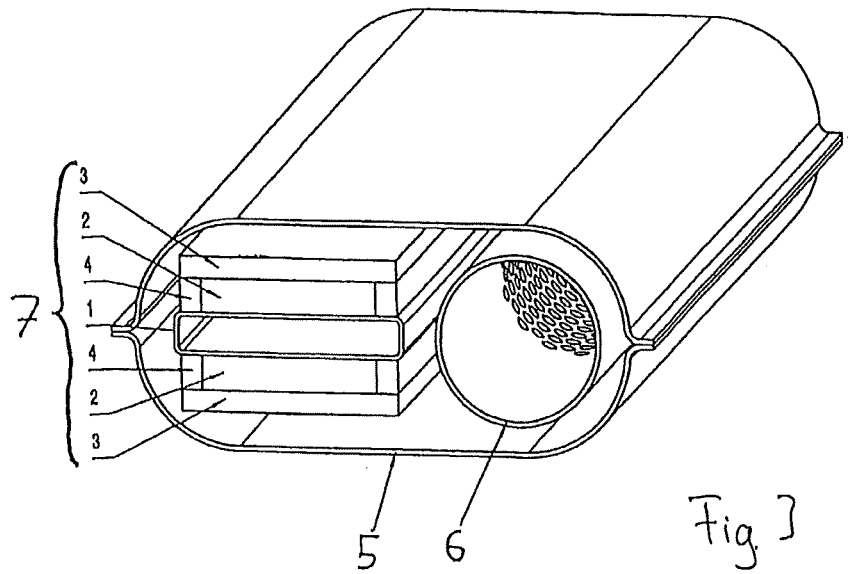
FIG. 3 is a perspective sectional view of another embodiment of the muffler.
Figure 4:
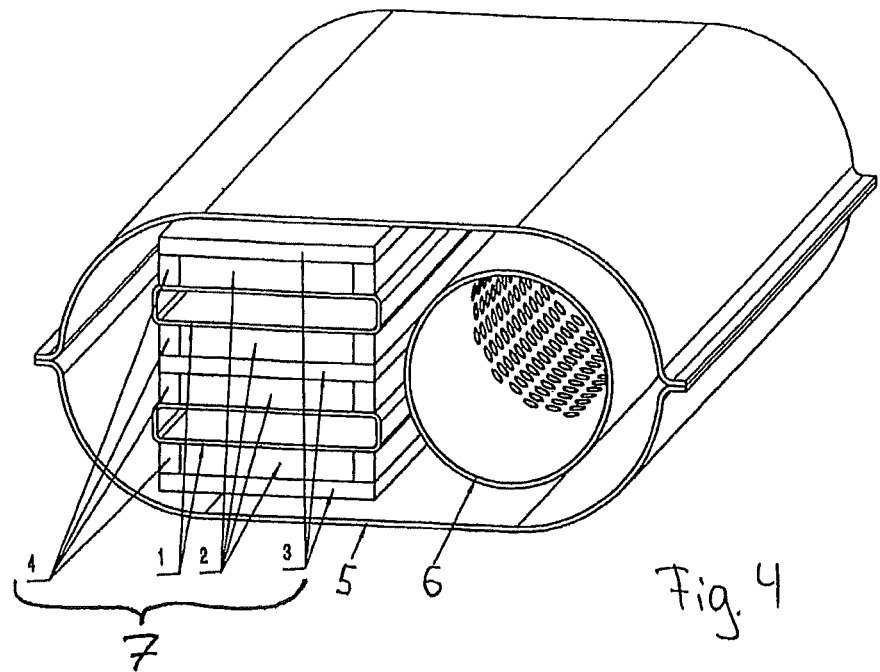
FIG. 4 is a perspective sectional view of another embodiment of the muffler.

In the embodiments in accordance with FIGS. 3 to 5, a pipe 6 is provided in addition to the generator arrangement 7 which can likewise be flowed through by exhaust gas and which here has a round cross-section and is provided with a perforation, but is not coupled to a thermoelectric generator. Other cross-sectional shapes are possible. The pipe 6 extends in parallel with the at least one duct 1 and is in flow communication therewith both at the exhaust gas inlet side and at the exhaust gas outlet side. The ducts 1 in the embodiments in accordance with FIGS. 3 to 5 do not have any perforation, with alternatively a perforation also being able to be provided here.

A particular embodiment of the generator arrangement 7 will be described in the following with reference to FIGS. 1 to 4. Insulation elements 4, by means of which the duct 1 and the associated cooling device 3 are mechanically coupled, are provided between a duct 1 and a cooling device 2 in the region of the duct edges in each case. The height of the insulation elements 4 is equal in size or slightly larger than the height of the thermoelectric generators 2 so that forces occurring between the duct 1 and the cooling device 3 being transmitted substantially only via the insulation elements 4. The height of the insulation elements 4 is in particular selected such that a respective uninterrupted heat transfer is possible between the thermoelectric generator 2 and the duct 1 or the cooling device 3. The material of the insulation elements 4 has a thermal conductivity which is as small as possible so that a thermal short-circuit between the high temperature side and the low temperature side of the thermoelectric generators 2 is avoided.

In the case of the embodiments in accordance with FIGS. 1 and 2, the height of the generator arrangement 7 is equal to the height of the muffler housing 5 so that the cooling device 3 provided at the top and at the bottom are in thermal conductive communication with the muffler housing. The muffler housing 5 thereby ultimately represents a temperature sink for the low temperature sides of the thermoelectric generators 2. An active cooling, in particular on a coolant circuit, can thus be dispensed with.

In the embodiments in accordance with FIGS. 3 to 5, the generator arrangement 7 is arranged spaced apart from the muffler housing 5. The mechanical strain on the generator arrangement 7, which can result, for example, due to different thermal expansions, can thereby be reduced. Optionally, a support between the generator arrangement 7 and the muffler housing 5 can be provided by suitable, preferably elastic, support elements (not shown).

Generally, instead of the single generator arrangement 7 shown in the Figures, a plurality of generator arrangements can also be provided, in particular arranged in parallel with one another. In addition, instead of the thermoelectric generators, other cooling elements can also be provided such as heat exchangers, evaporation coolers, recuperators or superheaters.

The mufflers in accordance with the invention can be provided at any desired point in the exhaust gas tract, in particular as premufflers, middle mufflers or postmufflers.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

The invention claimed is:

1. A muffler for an exhaust gas system of an internal combustion engine comprising:
   a muffler housing having at least one exhaust gas inlet and at least one exhaust gas outlet;
   at least one muffling device arranged in the muffler housing,
   at least one cooling element configured to extract heat energy from the exhaust gas and is arranged in the muffler housing, and
   at least one cooling device arranged in the muffler housing and thermally coupled to the cooling element, the cooling device having at least one coolant passage through which coolant can flow, the coolant passage formed as a flat passage;
   wherein the flat passage has first and second mutually oppositely disposed side surfaces of larger length in cross-section, the first and second mutually opposed side surfaces being coupled to the cooling element.

2. A muffler in accordance with claim 1, wherein the first and second mutually opposed side surfaces are coupled to a low temperature side of a thermoelectric generator.

3. A muffler for an exhaust gas system of an internal combustion engine comprising:
   a muffler housing having at least one exhaust gas inlet and at least one exhaust gas outlet;
   at least one muffling device arranged in the muffler housing,
   at least one cooling element configured to extract heat energy from the exhaust gas and is arranged in the muffler housing; and
   at least one duct, through which exhaust gas can flow, arranged in the muffler housing and thermally coupled to the cooling element;
   at least one cooling device arranged in the muffler housing, the cooling device and the duct thermally coupled via the cooling element and are mechanically coupled via thermally insulating insulation elements, with forces active between the cooling device and the duct only being transmitted via the insulation elements.

4. A muffler in accordance with claim 3, wherein the cooling device and the duct are thermally coupled via a thermoelectric generator.

5. A muffler for an exhaust gas system of an internal combustion engine comprising:
   a muffler housing having at least one exhaust gas inlet and at least one exhaust gas outlet;
   at least one muffling device arranged in the muffler housing,
   at least one cooling element configured to extract heat energy from the exhaust gas and is arranged in the muffler housing; and
   at least one duct, through which exhaust gas can flow, arranged in the muffler housing and thermally coupled to the cooling element;

wherein the duct is formed as a flat passage having first and second mutually oppositely disposed side surfaces of larger length in cross-section, with at least one of the first and second mutually oppositely disposed side surfaces being thermally coupled to the cooling element;

wherein at least one of the two mutually oppositely disposed side surfaces is thermally coupled to a high temperature side of a thermoelectric generator.

6. A muffler in accordance with claim 5, wherein the muffling device in the muffler housing is selected while taking account of the muffling power of the cooling element.

7. A muffler in accordance with claim 5, wherein the cooling element is a thermoelectric generator comprising a high temperature side in thermal transfer communication with the exhaust gas and a low temperature side shielded from the exhaust gas.

8. A muffler in accordance with claim 5, wherein the duct is thermally coupled to a high temperature side of a thermoelectric generator.

9. A muffler in accordance with claim 5, wherein the duct has perforations which are provided at wall sections not coupled to the cooling element.

10. A muffler in accordance with claim 5, wherein the muffler includes a pipe having at least one perforation at wall sections not coupled to the cooling element.

11. A muffler in accordance with claim 5, wherein the duct is formed as a flat passage having first and second mutually oppositely disposed side surfaces of larger length in cross-section, with at least one of the first and second mutually oppositely disposed side surfaces being thermally coupled to the cooling element.

12. A muffler in accordance with claim 5, wherein the cooling element is a heat exchanger.

13. A muffler in accordance with claim 12, wherein the heat exchanger is adapted for the flow therethrough of a cooling medium, the cooling medium comprising at least one of air, water and oil.

14. A muffler in accordance with claim 12, wherein the heat exchanger comprises at least one of an evaporation cooler, a recuperator and a superheater.

15. A muffler in accordance with claim 5, further comprising at least one cooling device arranged in the muffler housing and thermally coupled to the cooling element.

16. A muffler in accordance with claim 15, wherein the cooling device has at least one coolant passage through which coolant can flow.

17. A muffler in accordance with claim 16, wherein the coolant passage is formed as a flat passage.

18. A muffler in accordance with claim 5, wherein the muffling device includes the duct.

19. A muffler in accordance with claim 18, wherein the duct is the sole muffling device arranged in the muffler housing.

20. A muffler in accordance with claim 18, further comprising at least one additional muffling device arranged in the muffler housing with the cooling element.

21. A muffler in accordance with claim 20, wherein the additional muffling device is a pipe through which exhaust gas can flow and is not thermally coupled to the cooling element.

22. A muffler in accordance with claim 21, wherein the duct and the pipe are operatively connected to one another at the exhaust gas inlet and at the exhaust gas outlet.

* * * * *